United States Patent
Mackay et al.

(10) Patent No.: US 10,797,651 B2
(45) Date of Patent: Oct. 6, 2020

(54) AMPLIFIER OFFSET CANCELLATION USING AMPLIFIER SUPPLY VOLTAGE

(71) Applicants: Cirrus Logic International Semiconductor Ltd., Edinburgh (GB); Graeme Gordon Mackay, Austin, TX (US)

(72) Inventors: Graeme Gordon Mackay, Austin, TX (US); Lei Zhu, Austin, TX (US); Ku He, Austin, TX (US); Vamsikrishna Parupalli, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/348,824

(22) PCT Filed: Apr. 27, 2018

(86) PCT No.: PCT/US2018/029752
§ 371 (c)(1),
(2) Date: May 9, 2019

(87) PCT Pub. No.: WO2018/200934
PCT Pub. Date: Nov. 1, 2018

(65) Prior Publication Data
US 2020/0059200 A1   Feb. 20, 2020

Related U.S. Application Data

(63) Continuation of application No. 15/582,233, filed on Apr. 28, 2017, now Pat. No. 10,164,576.

(51) Int. Cl.
| | |
|---|---|
| *H03F 1/02* | (2006.01) |
| *H03F 3/45* | (2006.01) |
| *H03F 3/187* | (2006.01) |
| *H03F 3/213* | (2006.01) |
| *H03F 1/30* | (2006.01) |

(52) U.S. Cl.
CPC .......... *H03F 1/0233* (2013.01); *H03F 1/025* (2013.01); *H03F 1/0227* (2013.01); *H03F 1/30* (2013.01);
(Continued)

(58) Field of Classification Search
CPC ..................................................... H03F 1/0233
See application file for complete search history.

(56) References Cited

U.S. PATENT DOCUMENTS

| | | | |
|---|---|---|---|
| 4,283,683 A | 8/1981 | Main | |
| 5,559,467 A * | 9/1996 | Smedley | H03F 3/217 330/10 |

(Continued)

FOREIGN PATENT DOCUMENTS

EP          2434643 A2       3/2012

OTHER PUBLICATIONS

Combined Search and Examination Report under Sections 17 and 18(3), UKIPO, Application No. GB1708545.7, dated Nov. 21, 2017.

(Continued)

*Primary Examiner* — Patricia T Nguyen
(74) *Attorney, Agent, or Firm* — Jackson Walker L.L.P.

(57) ABSTRACT

In accordance with embodiments of the present disclosure, a method for power supply rejection for an amplifier may include generating a correction signal by multiplying a quantity indicative of a power supply voltage of the amplifier by a transfer function defining a response from the power supply voltage of the amplifier to an output signal of the amplifier and subtracting the correction signal from a signal within a signal path of a circuit comprising the amplifier.

18 Claims, 9 Drawing Sheets

(52) U.S. Cl.
CPC ............. *H03F 3/187* (2013.01); *H03F 3/213* (2013.01); *H03F 3/45475* (2013.01); *H03F 3/45973* (2013.01); *H03F 3/45982* (2013.01); *H03F 2200/03* (2013.01); *H03F 2200/375* (2013.01); *H03F 2200/511* (2013.01); *H03F 2203/45022* (2013.01); *H03F 2203/45042* (2013.01); *H03F 2203/45152* (2013.01); *H03F 2203/45212* (2013.01); *H03F 2203/45528* (2013.01); *H03F 2203/45588* (2013.01); *H03F 2203/45594* (2013.01); *H03F 2203/45596* (2013.01); *H03F 2203/45601* (2013.01); *H03F 2203/45681* (2013.01)

(56) References Cited

U.S. PATENT DOCUMENTS

| | | |
|---|---|---|
| 6,518,838 B1 | 2/2003 | Risbo |
| 6,741,123 B1 | 5/2004 | Andersen et al. |
| 6,943,620 B2 | 9/2005 | Andersen et al. |
| 8,138,826 B1 | 3/2012 | Bhatt et al. |
| 2003/0094932 A1 | 5/2003 | Knoedgen |
| 2004/0160351 A1 | 8/2004 | Rossi |
| 2006/0226898 A1* | 10/2006 | Vitunic .............. H05B 33/0815 330/9 |
| 2006/0284671 A1* | 12/2006 | Ohba .................. H03F 3/45183 330/9 |
| 2007/0183490 A1* | 8/2007 | Andersen .................. H03F 1/32 375/238 |
| 2007/0194845 A1 | 8/2007 | Kost et al. |
| 2009/0289709 A1 | 11/2009 | Khoury et al. |
| 2012/0034875 A1 | 2/2012 | Moritsuka et al. |
| 2014/0266444 A1 | 9/2014 | Scott et al. |

OTHER PUBLICATIONS

International Search Report and Written Opinion of the International Searching Authority, International Application No. PCT/US2018/029752, dated Aug. 1, 2018.

* cited by examiner

AMPLIFIER OFFSET CANCELLATION USING AMPLIFIER SUPPLY VOLTAGE

The present application is a 371 of International Patent Application No. PCT/US2018/029752, filed Apr. 27, 2018, which claims priority to U.S. patent application Ser. No. 15/582,233, filed Apr. 28, 2017, now U.S. Pat. No. 10,164,576, issued Dec. 25, 2018, each of which is incorporated by reference herein in its entirety.

FIELD OF DISCLOSURE

The present disclosure relates in general to circuits for audio devices, including without limitation personal audio devices such as wireless telephones and media players, and more specifically, to cancelling amplifier offset by applying a transfer function to an amplifier supply voltage.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Oftentimes, such power amplifier is implemented using, in addition to other circuit elements (e.g., operational amplifiers, etc.), impedances (e.g., electrical resistances) to set a gain of the power amplifier. However, mismatches among such resistors may lead to the amplifier having an offset that is applied to the signal to be amplified, and such offset may also be amplified by the amplifier itself, further exacerbating the presence of offset.

SUMMARY

In accordance with the teachings of the present disclosure, one or more disadvantages and problems associated with existing approaches to implementation of amplifiers may be reduced or eliminated.

In accordance with embodiments of the present disclosure, a method for power supply rejection for an amplifier may include generating a correction signal by multiplying a quantity indicative of a power supply voltage of the amplifier by a transfer function defining a response from the power supply voltage of the amplifier to an output signal of the amplifier and subtracting the correction signal from a signal within a signal path of a circuit comprising the amplifier.

In accordance with these and other embodiments of the present disclosure, a system for power supply rejection for an amplifier may include an input configured to receive a quantity indicative of a power supply voltage of the amplifier and control logic configured to generate a correction signal by multiplying the quantity indicative of the power supply voltage by a transfer function defining a response from the power supply voltage of the amplifier to an output signal of the amplifier and subtract the correction signal from a signal within a signal path of a circuit comprising the amplifier.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital path portion (e.g., an audio compressor) and an analog path portion (e.g., an audio expander). The analog path portion may include a TCFC amplifier to receive an analog signal generated by the digital path portion and apply a gain to the analog signal to generate an output signal, wherein said output signal may be communicated to a loudspeaker for playback and/or to other circuitry for processing.

Figure 1:
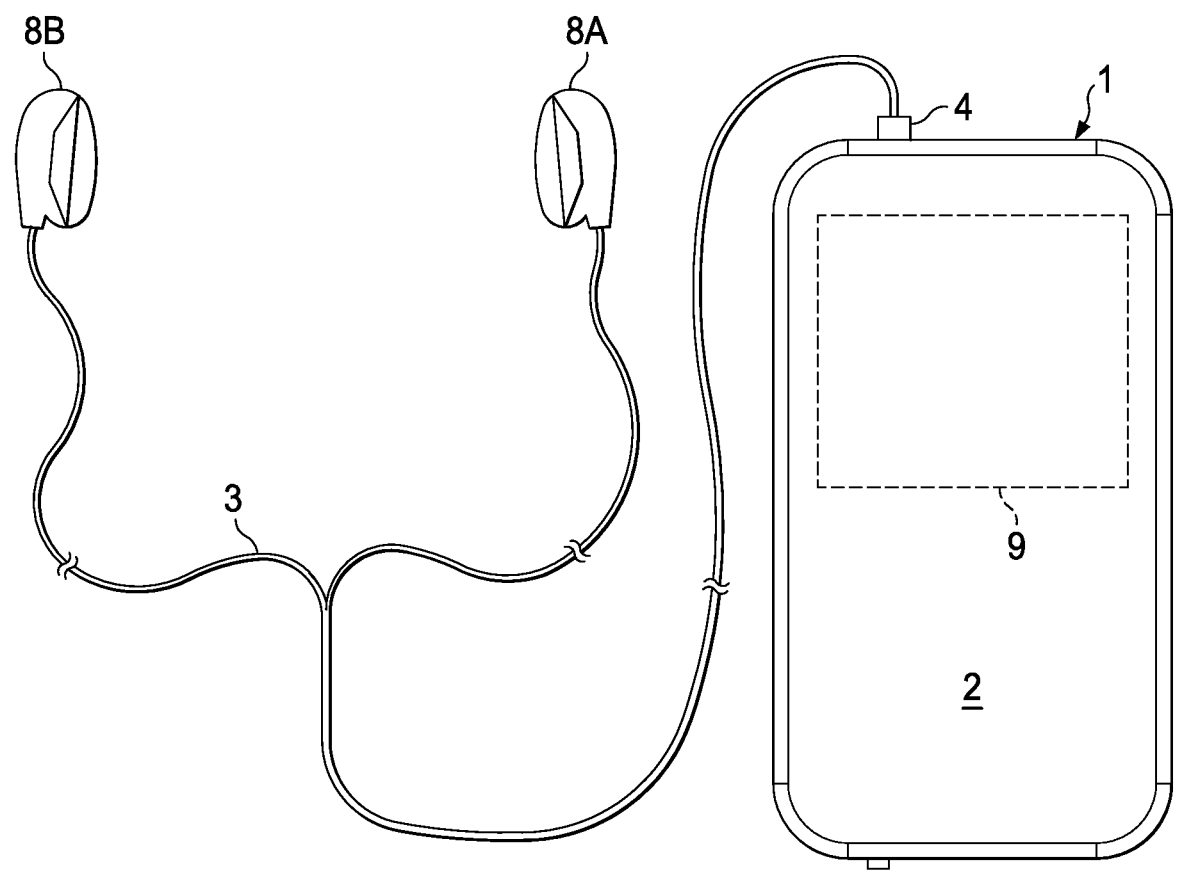
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
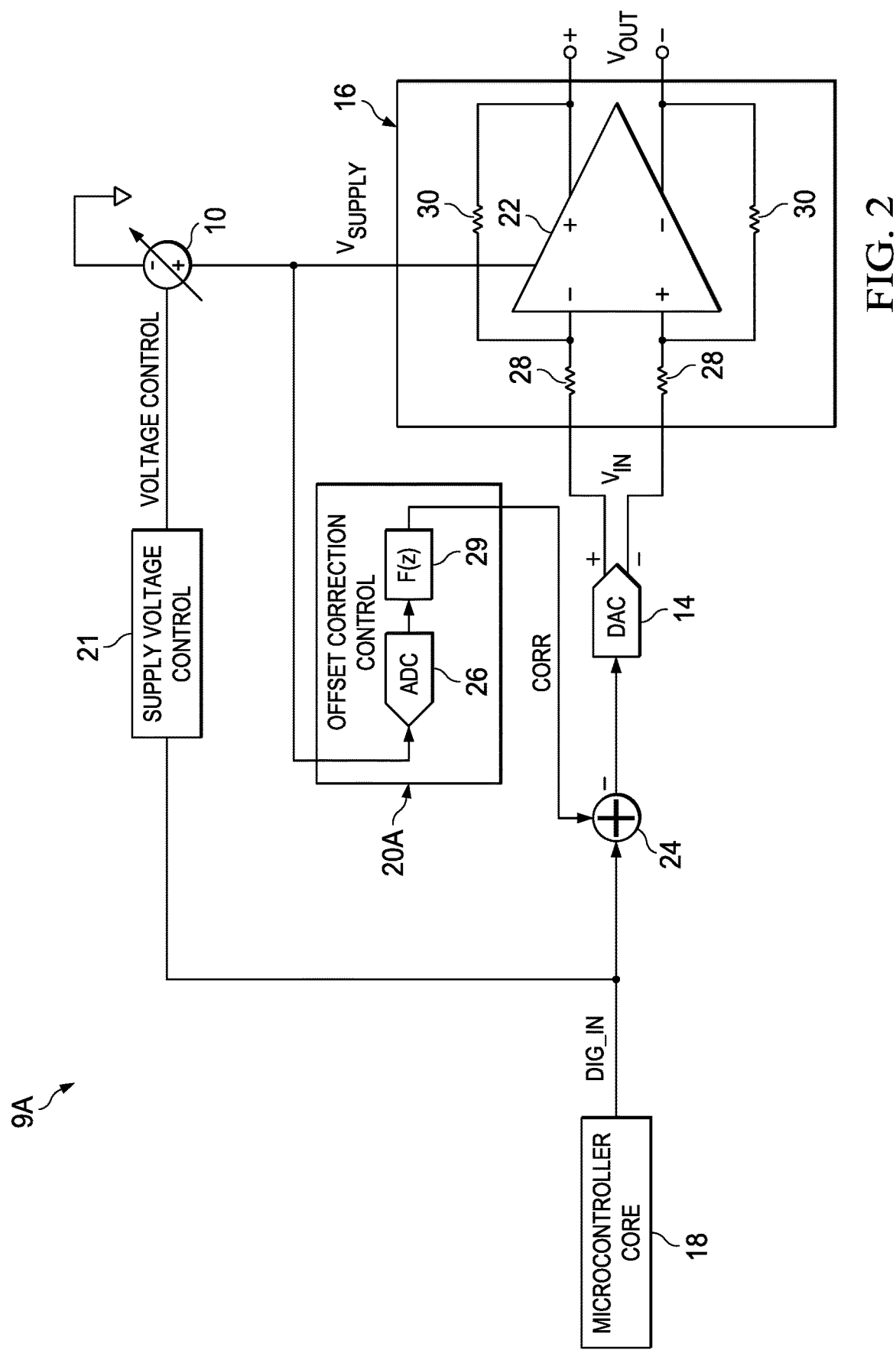
FIG. 2 is a block diagram of selected components of an example audio integrated circuit of a personal audio device, in accordance with embodiments of the present disclosure.

FIG. 2 is a block diagram of selected components of an example audio IC 9A of a personal audio device, in accordance with embodiments of the present disclosure. In some embodiments, example audio IC 9A may be used to implement audio IC 9 of FIG. 1. As shown in FIG. 2, a microcontroller core 18 may supply a digital audio input signal DIG_IN to a combiner 24 which may subtract a digital correction signal CORR from digital audio input signal DIG_IN to generate a corrected digital audio input signal. Such corrected digital audio input signal may be received by a digital-to-analog converter (DAC) 14, which may convert the digital audio input signal to an intermediate analog signal $V_{IN}$.

DAC 14 may supply intermediate analog signal $V_{IN}$ to an amplifier 16 which may amplify or attenuate audio input signal $V_{IN}$ in conformity with a gain to provide an audio output signal $V_{OUT}$, which may operate a speaker, headphone transducer, a line level signal output, and/or other suitable output. Amplifier 16 may comprise an operational amplifier 22, input resistors 28, and feedback resistors 30 coupled together as shown in FIG. 2. Amplifier 16 may include any suitable circuit for amplifying an electrical signal, including without limitation a Class-AB amplifier, a Class-D amplifier, a Class-G amplifier, a Class-H amplifier, or any suitable combination thereof.

The resistances of input resistors 28 and feedback resistors 30 may set a gain for amplifier 16. Although resistors 28 and 30 are depicted in FIG. 2 as having fixed resistances for the purpose of descriptive clarity, in some embodiments, resistors 28 and/or resistors 30 may have variable, controllable resistances which may be varied to control a variable gain of amplifier 16. Due to mismatches among resistors 28 and/or resistors 30, an offset may be created at the input terminals of operational amplifier 22 in the absence of control circuitry for cancelling such offset. Such offset may be cancelled by offset correction control circuit 20A, as described in greater detail below.

As depicted in FIG. 2, amplifier 16 may be supplied electrical energy from signal-variant power supply 10. Signal-variant power supply 10 may output a variable supply voltage $V_{SUPPLY}$ based on one or more control signals VOLTAGE CONTROL communicated from supply voltage control circuit 21, as described in greater detail below. Supply voltage $V_{SUPPLY}$ output by signal-variant power supply 10 may be selected from a plurality of discrete voltages (e.g., as in a Class-G amplifier), or may include an infinite number of voltages between a minimum and maximum voltage (e.g., as in a Class-H amplifier). Signal-variant power supply 10 may comprise any suitable power supply for supplying electrical energy to a load, including without limitation, a boost converter power supply, a buck converter power supply, a buck-boost converter power supply, and a linear power supply.

Supply voltage control circuit 21 may include an input for receiving digital audio input signal DIG_IN (or a signal derived therefrom) and an output for outputting at least one control signal (e.g., VOLTAGE CONTROL) for controlling the power supply level of signal-variant power supply 10. Supply voltage control circuit 21 may be configured to monitor digital audio input signal DIG_IN (or a signal derived therefrom) and based thereon, set a power supply level of signal-variant power supply 10 and output the at least one control signal (e.g., VOLTAGE CONTROL) to control the power supply voltage $V_{SUPPLY}$. In some embodiments, the at least one control signal (e.g., VOLTAGE CONTROL) may set power supply voltage $V_{SUPPLY}$ generated by signal-variant power supply 10 to satisfy one or more requirements for amplifier 16. Such requirements may include any suitable requirements for amplifier 16 or audio output signal $V_{OUT}$ generated by amplifier 16, including without limitation an acceptable distortion level, an acceptable noise level, a required voltage supply headroom, a frequency range, and/or any other suitable requirement.

To cancel offset of amplifier 16, offset correction control circuit 20A may receive a quantity indicative of a power supply voltage $V_{SUPPLY}$ (e.g., power supply voltage $V_{SUPPLY}$ itself or another signal indicative of power supply voltage $V_{SUPPLY}$ such as a digital signal generated from power supply voltage $V_{SUPPLY}$) and generate a correction signal CORR by multiplying the quantity indicative of power supply voltage $V_{SUPPLY}$ by a transfer function F(z) defining a response from power supply voltage $V_{SUPPLY}$ of amplifier 16 to an output signal (e.g., audio output signal $V_{OUT}$) of amplifier 16. For example, because power supply voltage $V_{SUPPLY}$ is in the analog domain, offset correction control circuit 20A may include analog-to-digital converter (ADC) 26 in order to convert power supply voltage $V_{SUPPLY}$ into an equivalent digital signal, and may include transfer function block 29 to multiply transfer function F(z) by the equivalent digital signal of power supply voltage $V_{SUPPLY}$ to generate correction signal CORR. As noted above, combiner 24 may subtract correction signal CORR from digital audio input signal DIG_IN to generate a corrected digital audio input signal, effectively cancelling (at least in part) offset present in amplifier 16. Although FIG. 2 depicts the subtraction of correction signal CORR from digital audio input signal DIG_IN to generate a corrected digital audio input signal, such correction signal may be subtracted from any suitable signal within the signal path of audio IC 9A in order to cancel offset present in amplifier 16.

Figure 3:
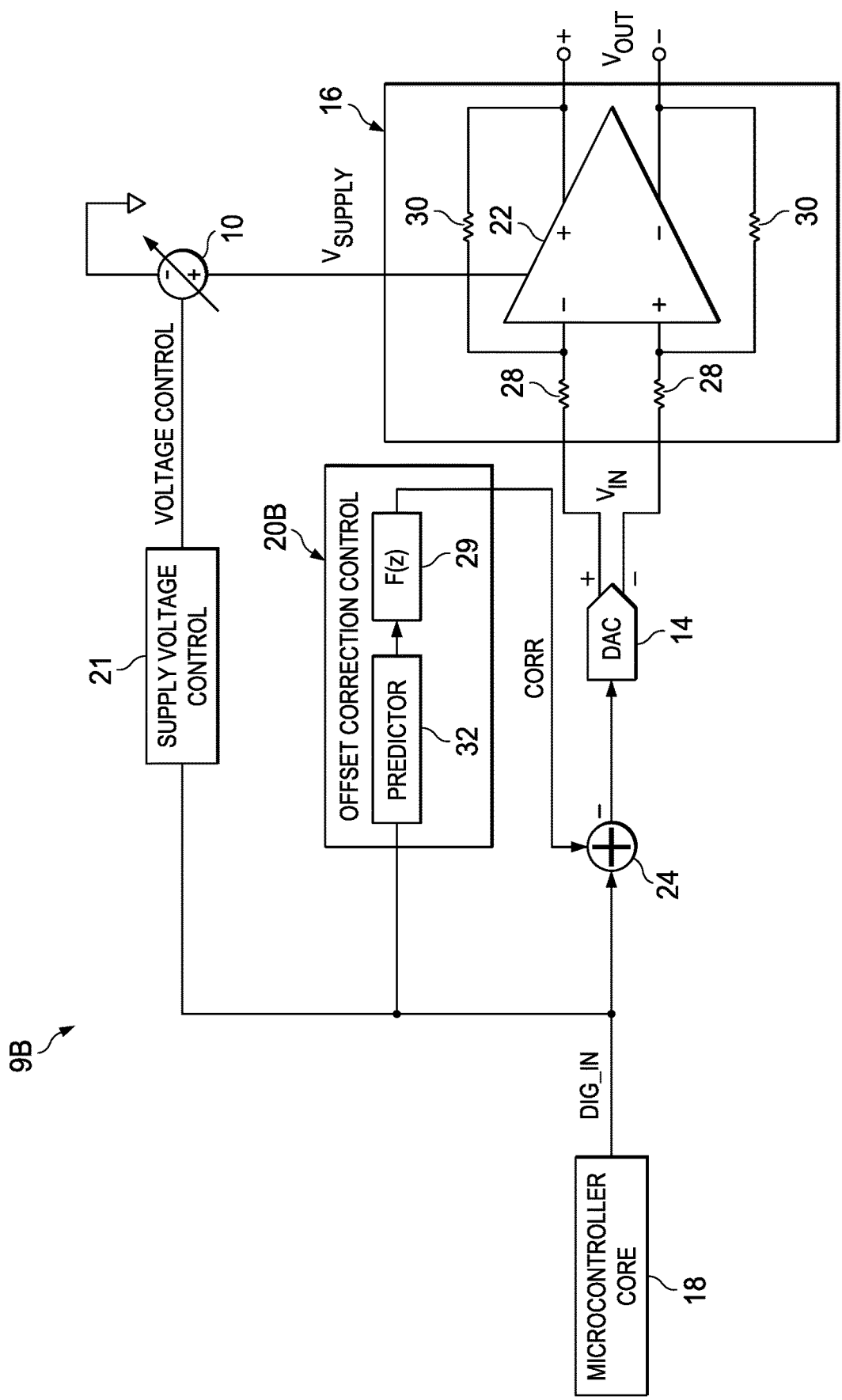
FIG. 3 is a block diagram of selected components of another example audio integrated circuit of a personal audio device, in accordance with embodiments of the present disclosure.

Although FIG. 2 depicts offset cancellation by using a digital equivalent of the actual power supply voltage $V_{SUPPLY}$, in some embodiments, an offset correction control circuit may use a predicted estimate of power supply voltage $V_{SUPPLY}$ based on an input signal (e.g., digital audio input signal DIG_IN) of the signal path. FIG. 3 is a block diagram of selected components of another example audio integrated circuit 9B of a personal audio device, in accordance with embodiments of the present disclosure. In some embodiments, example audio IC 9B may be used to implement audio IC 9 of FIG. 1. Example audio IC 9B of FIG. 3 may be similar in many respects to example audio IC 9A of FIG. 2. Accordingly, the discussion of FIG. 3 below may be focused on the substantial differences between example audio IC 9B and example audio IC 9A. Most notably, example audio IC 9B may include offset correction control circuit 20B in lieu of offset correction control circuit 20A of example audio IC 9A. Offset correction control circuit 20B may include a predictor block 32 to receive digital audio input signal DIG_IN (or another signal derived therefrom) and predict an estimate of power supply voltage $V_{SUPPLY}$ that may be set by supply voltage control circuit 21 in response to digital audio input signal DIG_IN. Such predicted estimate of power supply voltage $V_{SUPPLY}$ may be processed by transfer function block 29 to multiply transfer function F(z) by the predicted estimate of power supply voltage $V_{SUPPLY}$ to generate correction signal CORR.

Figure 4:
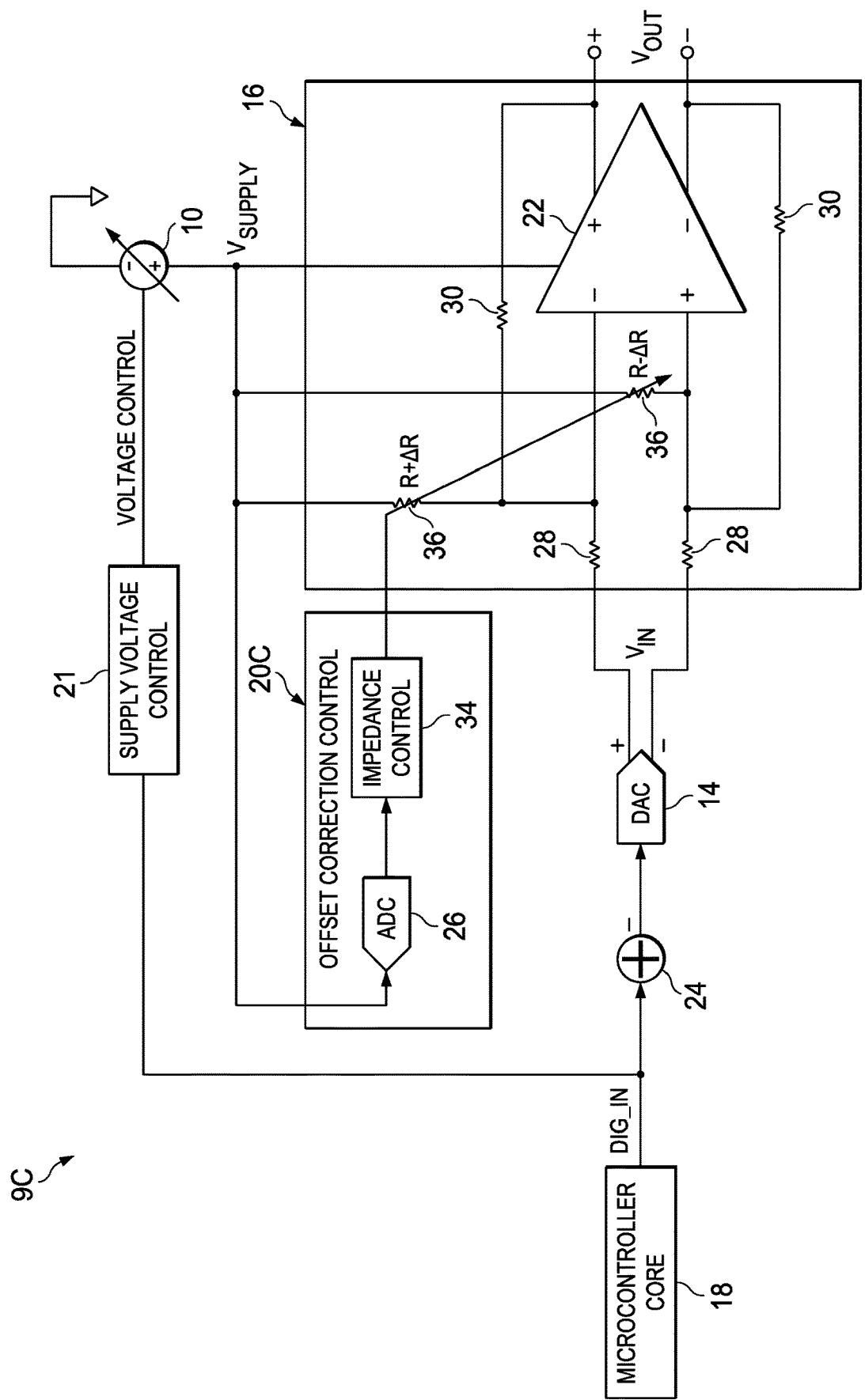
FIG. 4 is a block diagram of selected components of another example audio integrated circuit of a personal audio device, in accordance with embodiments of the present disclosure.

Although FIGS. 2 and 3 depict offset cancellation by subtracting a correction signal in the digital domain of a signal path, in some embodiments, an offset correction control circuit may generate a correction signal that is subtracted from a signal within an analog portion of a signal path. FIG. 4 is a block diagram of selected components of another example audio integrated circuit 9C of a personal audio device, in accordance with embodiments of the present disclosure. In some embodiments, example audio IC 9C may be used to implement audio IC 9 of FIG. 1. Example audio IC 9C of FIG. 4 may be similar in many respects to example audio IC 9A of FIG. 2 and example audio IC 9B of FIG. 3. Accordingly, the discussion of FIG. 4 below may be focused on the substantial differences between example audio IC 9C on the one hand and example audio IC 9A and example audio IC 9B on the other hand. Most notably, example audio IC 9C may include offset correction control circuit 20C in lieu of either offset correction control circuit 20A of example audio IC 9A and offset correction control circuit 20B of example audio IC 9B, and may exclude combiner 24. Offset correction control circuit 20C may include ADC 26 in order to convert power supply voltage $V_{SUPPLY}$ into an equivalent digital signal, and may include impedance control block 34 to control a differential variable impedance comprising resistors 36 (one having resistance R+ΔR and one having resistance R−ΔR) coupled between power supply voltage $V_{SUPPLY}$ and each of the differential inputs of operational amplifier 22. In operation, impedance control block 34 may control the ΔR components of resistors 36 such that the variable impedance may apply to power supply voltage $V_{SUPPLY}$ a transfer function defining a response from power supply voltage $V_{SUPPLY}$ of amplifier 16 to an output signal (e.g., audio output signal Your) of amplifier 16, thus generating an analog correction signal to the differential inputs of operational amplifier 22 to cancel (at least in part) offset within amplifier 16.

Figure 5:
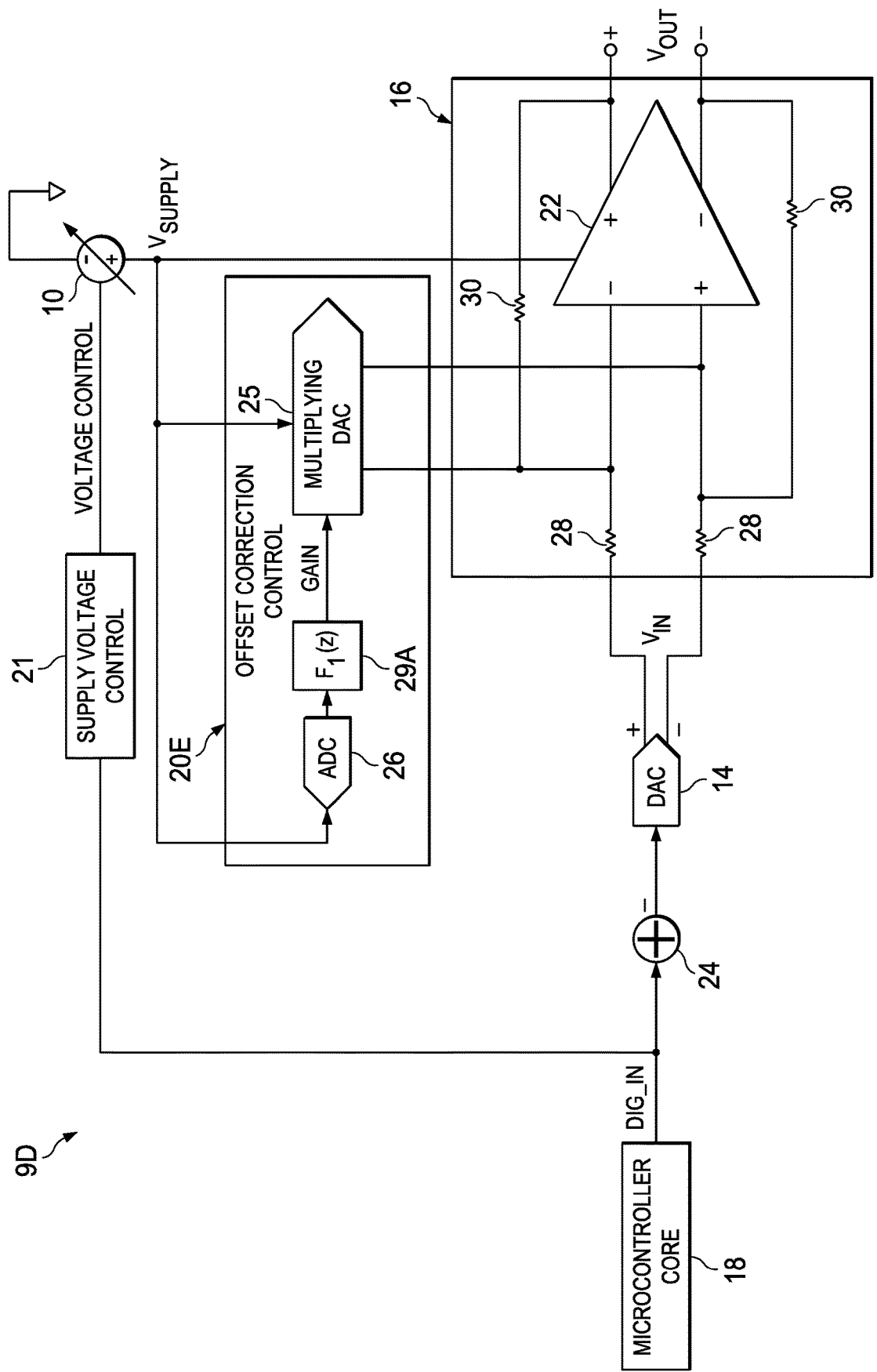
FIG. 5 is a block diagram of selected components of another example audio integrated circuit of a personal audio device, in accordance with embodiments of the present disclosure.

FIG. 5 is a block diagram of selected components of another example audio integrated circuit 9D of a personal audio device, in accordance with embodiments of the present disclosure. In some embodiments, example audio IC 9D may be used to implement audio IC 9 of FIG. 1. Example audio IC 9D of FIG. 5 may be similar in many respects to example audio IC 9A of FIG. 2, example audio IC 9B of FIG. 3, and example audio IC 9C of FIG. 4. Accordingly, the discussion of FIG. 5 below may be focused on the substantial differences between example audio IC 9D on the one hand and example audio IC 9A, example audio IC 9B, and example audio IC 9C on the other hand. Most notably, example audio IC 9D may include offset correction control circuit 20E in lieu of offset correction control circuit 20C of example audio IC 9C. Offset correction control circuit 20E may include ADC 26 in order to convert power supply voltage $V_{SUPPLY}$ into an equivalent digital signal, and may and may include transfer function block 29A to multiply transfer function $F_1(z)$ by the equivalent digital signal of power supply voltage $V_{SUPPLY}$ to generate digital gain signal GAIN. A multiplying DAC 25 may multiply power supply voltage $V_{SUPPLY}$ by digital gain signal GAIN to generate offset signals applied to each of the differential inputs of operational amplifier 22. In operation, the combination of transfer function $F_1(z)$ and multiplying DAC 25 may be effectively approximately equal to transfer function F(z), thus generating an analog correction signal to the differential inputs of operational amplifier 22 to cancel (at least in part) offset within amplifier 16.

Figure 6:
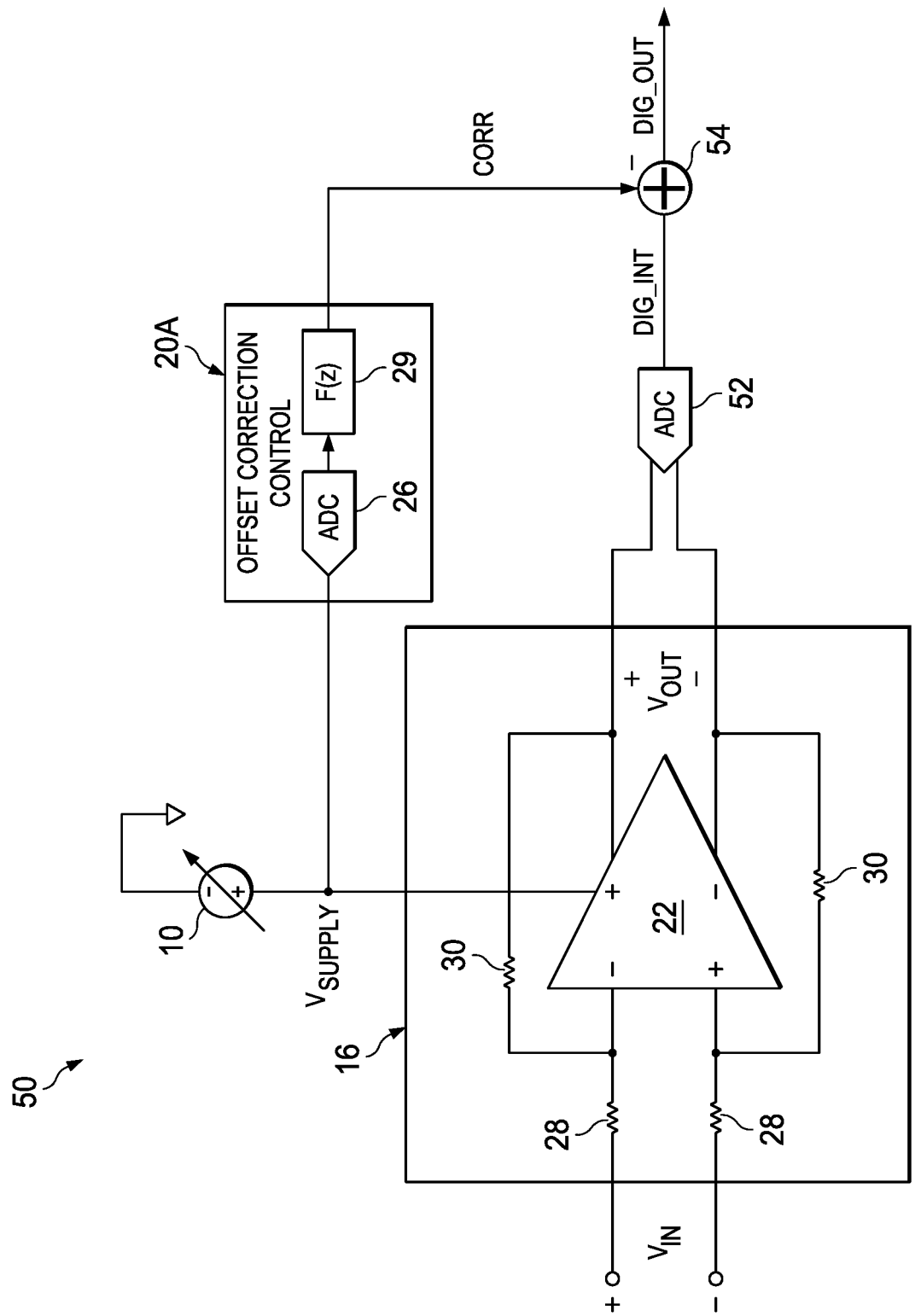
FIG. 6 is a block diagram of selected components of another example audio integrated circuit of a personal audio device, in accordance with embodiments of the present disclosure.

Although FIGS. 2-5 depict offset cancellation by subtracting a correction signal from the input side of amplifier 16, in some embodiments, an offset correction control circuit may generate a correction signal that is subtracted from a signal on the output side of amplifier 16. As shown in FIG. 6, circuit 50 may include an amplifier 16 for receiving analog input signal $V_1$ and generating an intermediate analog signal $V_O$. As shown in FIG. 6, amplifier 16 of circuit 50 may be similar or identical to amplifier 16 depicted in FIGS. 2-5. An ADC 52 may receive the intermediate analog signal $V_O$ and convert it to a digital equivalent signal DIG_INT. A combiner 54 may subtract a digital correction signal CORR from digital signal DIG_INT to generate a digital output signal DIG_OUT.

To cancel offset of amplifier 16, circuit 50 may include an offset correction control circuit 20A similar or identical to that depicted in FIG. 2. In circuit 50, offset control circuit 20A may receive a quantity indicative of a power supply voltage $V_{SUPPLY}$ (e.g., power supply voltage $V_{SUPPLY}$ itself or another signal indicative of power supply voltage $V_{SUPPLY}$ such as a digital signal generated from power supply voltage $V_{SUPPLY}$) and generate a correction signal CORR by multiplying the quantity indicative of power supply voltage $V_{SUPPLY}$ by a transfer function F(z) defining a response from power supply voltage $V_{SUPPLY}$ of amplifier 16 to an output signal (e.g., intermediate analog signal $V_O$) of amplifier 16. As noted above, combiner 54 may subtract correction signal CORR from digital signal DIG_INT to generate digital output signal DIG_OUT, effectively cancelling (at least in part) offset present in amplifier 16.

Figure 7:
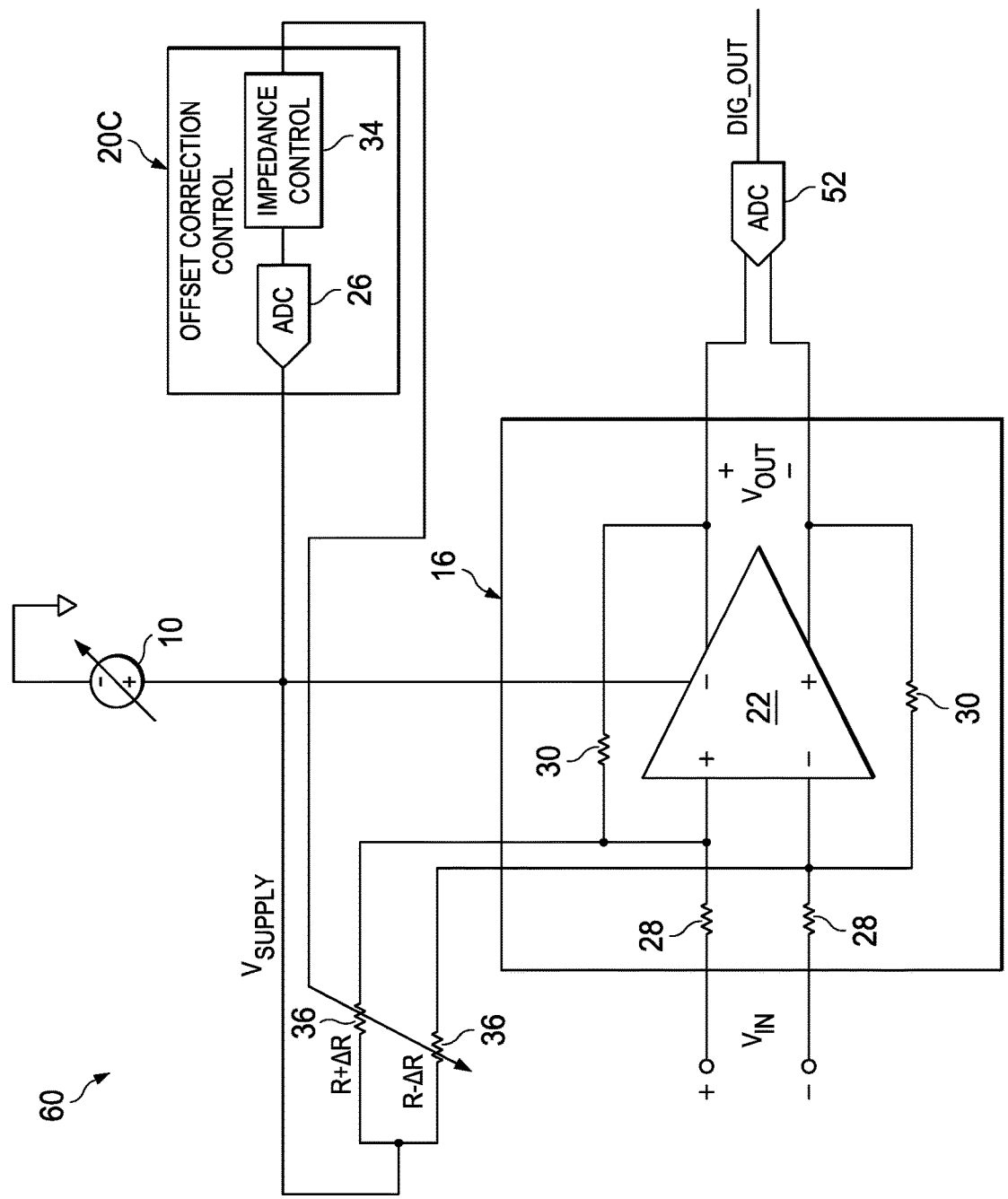
FIG. 7 is a block diagram of selected components of an example circuit for amplifying and converting an analog input signal into a digital output signal, in accordance with embodiments of the present disclosure.

Although FIG. 6 depicts offset cancellation by subtracting a correction signal in the digital domain of a signal path, in some embodiments, an offset correction control circuit may generate a correction signal that is subtracted from a signal within an analog portion of a signal path. FIG. 7 is a block diagram of selected components of an example circuit 60 for amplifying and converting an analog input signal $V_1$ into a digital output signal DIG_OUT, in accordance with embodiments of the present disclosure. Example audio circuit 60 of FIG. 7 may be similar in many respects to example audio circuit 50 of FIG. 6. Accordingly, the discussion of FIG. 7 below may be focused on the substantial differences between example circuit 60 and example circuit 50. Most notably, example circuit 60 may include offset correction control circuit 20C in lieu of offset correction control circuit 20A of example circuit 50, and may exclude combiner 54. Offset correction control circuit 20C may be similar or identical to offset correction control circuit 20C of FIG. 4 and thus may comprise a ADC 26 and an impedance control block 34 to control a differential variable impedance comprising resistors 36 (one having resistance R+ΔR and one having resistance R−ΔR) coupled between power supply voltage $V_{SUPPLY}$ and each of the differential inputs of operational amplifier 22. In operation, impedance control block 34 may control the ΔR components of resistors 36 such that the variable impedance may apply to power supply voltage $V_{SUPPLY}$ a transfer function defining a response from power supply voltage $V_{SUPPLY}$ of amplifier 16 to an output signal (e.g., audio output signal $V_{OUT}$) of amplifier 16, thus generating an analog correction signal to the differential inputs of operational amplifier 22 to cancel (at least in part) offset within amplifier 16.

Figure 8:
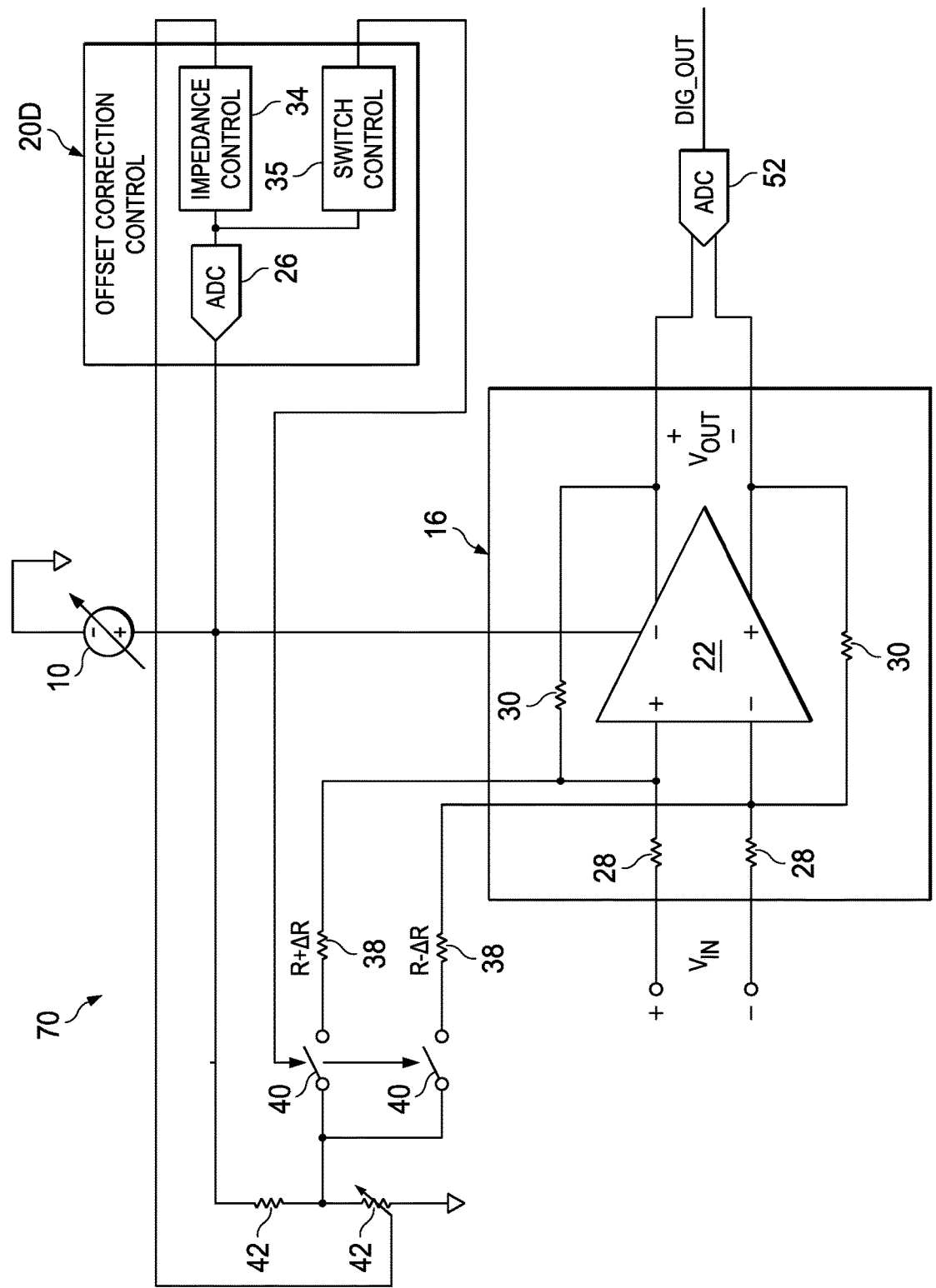
FIG. 8 is a block diagram of selected components of another example circuit for amplifying and converting an analog input signal into a digital output signal, in accordance with embodiments of the present disclosure.

FIG. 8 is a block diagram of selected components of an example circuit 70 for amplifying and converting an analog input signal $V_1$ into a digital output signal DIG_OUT, in accordance with embodiments of the present disclosure. Example circuit 70 of FIG. 8 may be similar in many respects to example circuit 60 of FIG. 7. Accordingly, the discussion of FIG. 8 below may be focused on the substantial differences between example circuit 70 and example circuit 60. Most notably, example circuit 70 may include offset correction control circuit 20D in lieu of offset correction control circuit 20C of example circuit 60. Offset correction control circuit 20D is similar in many respects to offset correction control circuit 20C, except that offset correction control circuit 20D also includes a switch control block 35. In operation, impedance control block 34 may control an impedance 42 of a voltage divider of supply voltage $V_{SUPPLY}$ and switch control block 35 may control switches 40 for selectively coupling resistors 38 with fixed resistance R to a respective polarity input of operational amplifier 22. Thus, offset correction control circuit 20D may generate an offset correction by enabling one of the switched resistors 38 based on a polarity of a measured offset, and controlling a resistance of impedance 42 to set a magnitude for the offset.

Figure 9:
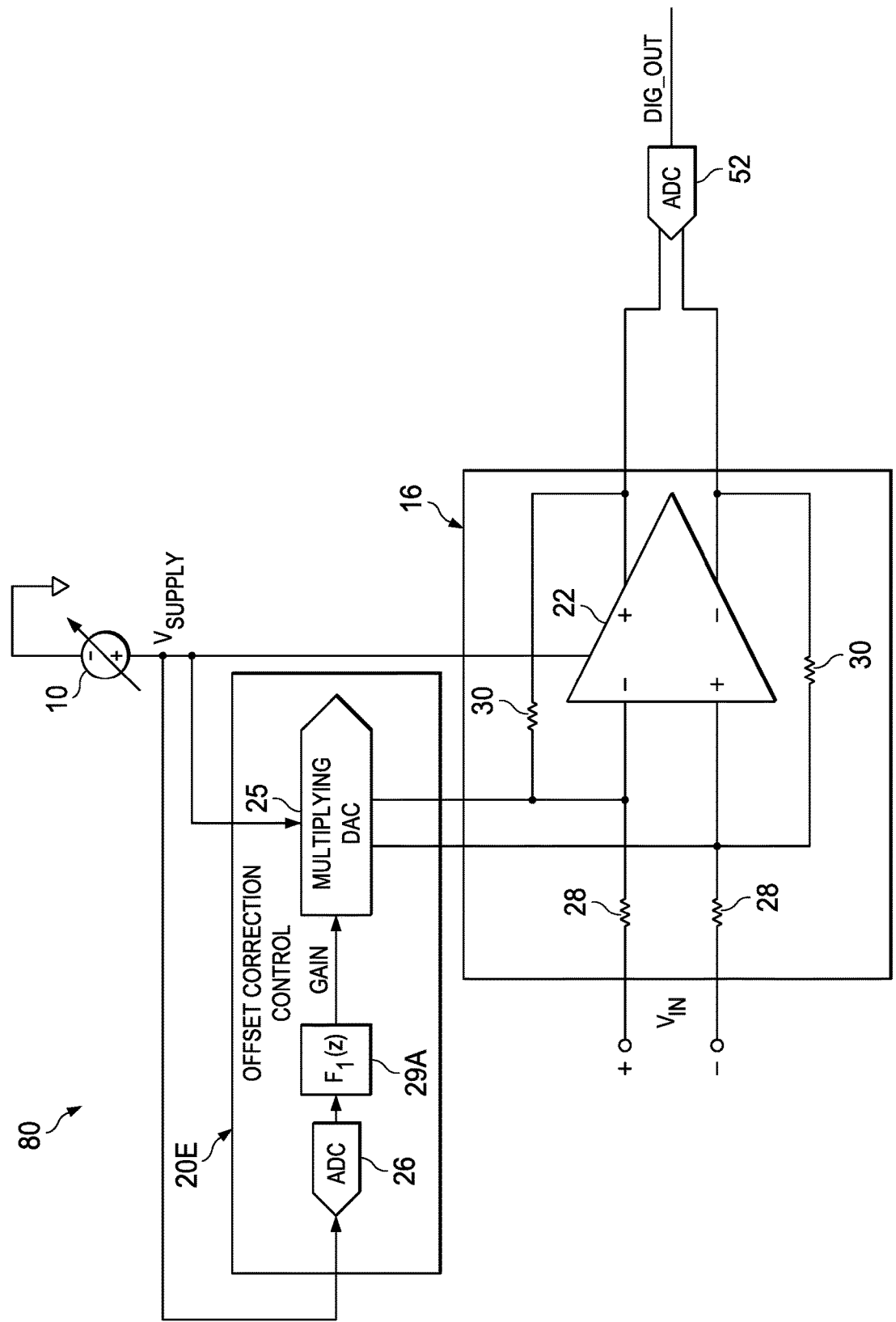
FIG. 9 is a block diagram of selected components of another example circuit for amplifying and converting an analog input signal into a digital output signal, in accordance with embodiments of the present disclosure.

FIG. 9 is a block diagram of selected components of an example circuit 80 for amplifying and converting an analog input signal $V_1$ into a digital output signal DIG_OUT, in accordance with embodiments of the present disclosure. Example audio circuit 80 of FIG. 9 may be similar in many respects to example audio circuit 60 of FIG. 7. Accordingly, the discussion of FIG. 9 below may be focused on the substantial differences between example circuit 80 and example circuit 60. Most notably, example circuit 80 may include offset correction control circuit 20E in lieu of offset correction control circuit 20C of example circuit 60. Offset correction control circuit 20E may be similar in many respects to offset correction control circuit 20E, depicted in FIG. 5. Offset correction control circuit 20E may include ADC 26 in order to convert power supply voltage $V_{SUPPLY}$ into an equivalent digital signal, and may and may include transfer function block 29A to multiply transfer function $F_1(z)$ by the equivalent digital signal of power supply voltage $V_{SUPPLY}$ to generate digital gain signal GAIN. A multiplying DAC 25 may multiply power supply voltage $V_{SUPPLY}$ by digital gain signal GAIN to generate offset signals applied to each of the differential inputs of operational amplifier 22. In operation, the combination of transfer function $F_1(z)$ and multiplying DAC 25 may be effectively approximately equal to transfer function F(z), thus generating an analog correction signal to the differential inputs of operational amplifier 22 to cancel (at least in part) offset within amplifier 16.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A method for power supply offset rejection for an amplifier, comprising:
   converting a power supply voltage of the amplifier into a quantity indicative of the power supply voltage, wherein the quantity is a digital signal;
   generating a correction signal by multiplying the quantity by a transfer function defining a response from the power supply voltage to an output signal of the amplifier; and
   subtracting the correction signal from a signal within a signal path of a circuit comprising the amplifier.

2. The method of claim 1, wherein the amplifier comprises an audio amplifier.

3. The method of claim 1, wherein subtracting the correction signal from the signal comprises subtracting the correction signal from an analog signal within an analog domain of the signal path.

4. The method of claim 3, wherein the correction signal is applied through a multiplying digital-to-analog converter.

5. The method of claim 1, wherein subtracting the correction signal from the signal comprises subtracting the correction signal from a digital signal within a digital domain of the signal path.

6. The method of claim 5, wherein the quantity indicative of the power supply voltage is a predicted estimate of the power supply voltage based on an input signal of the signal path.

7. The method of claim 5, wherein subtracting the correction signal comprises subtracting the correction signal from an input signal of the amplifier.

8. The method of claim 5, wherein subtracting the correction signal comprises subtracting the correction signal from the output signal of the amplifier.

9. The method of claim 1, wherein the quantity is an equivalent digital signal of the power supply voltage.

10. A system for power supply offset rejection for an amplifier, comprising:
    an input configured to receive a quantity indicative of a power supply voltage of the amplifier, wherein the quantity is a digital signal; and
    a control circuit configured to:
       generate a correction signal by multiplying the quantity by a transfer function defining a response from the power supply voltage to an output signal of the amplifier; and
       subtract the correction signal from a signal within a signal path of a circuit comprising the amplifier.

11. The system of claim 10, wherein the amplifier comprises an audio amplifier.

12. The system of claim 10, wherein the control circuit is configured to subtract the correction signal from the signal by subtracting the correction signal from an analog signal within an analog domain of the signal path.

13. The system of claim 12, wherein the control circuit is configured to apply the correction signal through a multiplying digital-to-analog converter.

14. The system of claim 10, wherein the control circuit is configured to subtract the correction signal from a digital signal within a digital domain of the signal path.

15. The system of claim 14, wherein the quantity indicative of the power supply voltage is a predicted estimate of the power supply voltage based on an input signal of the signal path.

16. The system of claim 14, wherein the control circuit is configured to subtract the correction signal from an input signal of the amplifier.

17. The system of claim 14, wherein the control circuit is configured to subtract the correction signal from the output signal of the amplifier.

18. The system of claim 10, wherein the quantity is an equivalent digital signal of the power supply voltage.

* * * * *